(12) United States Patent
Choi

(10) Patent No.: US 8,188,517 B2
(45) Date of Patent: May 29, 2012

(54) THREE-DIMENSIONAL NONVOLATILE MEMORY DEVICE AND METHOD FOR FABRICATING THE SAME

(75) Inventor: Eun-Seok Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 301 days.

(21) Appl. No.: 12/560,171

(22) Filed: Sep. 15, 2009

(65) Prior Publication Data

US 2010/0327323 A1    Dec. 30, 2010

(30) Foreign Application Priority Data

Jun. 30, 2009    (KR) .................. 10-2009-0059040

(51) Int. Cl.
*H01L 23/52* (2006.01)

(52) U.S. Cl. .................. 257/211; 257/314; 257/324

(58) Field of Classification Search .................. 257/202, 257/211
See application file for complete search history.

(56) References Cited

U.S. PATENT DOCUMENTS

| 6,288,959 B1* | 9/2001 | OuYang et al. | 365/203 |
| 6,771,536 B2* | 8/2004 | Li et al. | 365/185.02 |
| 2008/0258203 A1* | 10/2008 | Happ et al. | 257/324 |

FOREIGN PATENT DOCUMENTS

| CN | 101290938 | 10/2008 |
| JP | 2009-027136 | 2/2009 |
| KR | 1020100068522 | 6/2010 |

OTHER PUBLICATIONS

Office Action issued by the Chinese Patent Office on Dec. 23, 2011.
Notice of Preliminary Rejection issued from Korean Intellectual Property Office on Dec. 28, 2010.
Notice of Allowance issued from Korean Intellectual Property Office on Mar. 29, 2011.

\* cited by examiner

*Primary Examiner* — Matthew Landau
*Assistant Examiner* — Robert Bachner
(74) *Attorney, Agent, or Firm* — IP & T Group LLP

(57) ABSTRACT

A three-dimensional nonvolatile memory device includes: a plurality of channel structures extending in parallel in a first direction and comprising a plurality of channel layers that are alternatively stacked with a plurality of interlayer insulating layers over a substrate; a plurality of memory cells stacked along sidewalls of the channel structures and arranged in the first direction and a second direction crossing the first direction; and a plurality of word lines extending in parallel in the second direction and connected to the memory cells arranged in the second direction.

19 Claims, 17 Drawing Sheets

A - A' PLAN VIEW

B - B' CROSS-SECTIONAL VIEW

US 8,188,517 B2

THREE-DIMENSIONAL NONVOLATILE MEMORY DEVICE AND METHOD FOR FABRICATING THE SAME

CROSS-REFERENCE TO RELATED APPLICATIONS

The present invention claims priority of Korean Patent Application No. 10-2009-0059040, filed on Jun. 30, 2009, the disclosure of which is incorporated herein by reference in its entirety.

BACKGROUND OF THE INVENTION

The present invention relates to a nonvolatile memory device and a method for fabricating the same, and more particularly, to a three-dimensional (3D) nonvolatile memory device and a method for fabricating the same.

Nonvolatile memory devices retain stored data even when power is interrupted. Two-dimensional (2D) memory devices fabricated in a single layer on a silicon substrate have limitations in improving integration density. Therefore, 3D nonvolatile memory devices with memory cells stacked vertically from a silicon substrate have been proposed.

Hereinafter, a conventional method for fabricating a 3D nonvolatile memory device will be described with reference to the accompanying drawings.

FIGS. 1A to 4B illustrate a conventional process for fabricating a 3D nonvolatile memory device. Herein, Figures "A" are cross-sectional views of intermediate resulting structures, and Figures "B" are plan views at a height A-A' of Figures "A".

Referring to FIGS. 1A and 1B, an interlayer insulating layer 11 and a gate electrode conductive layer 12 are formed on a substrate 10. The gate electrode conductive layer 12 and the interlayer insulating layer 11 are etched to form contact holes H exposing the substrate 10.

A gate dielectric layer 1 is formed on inner walls of the contact holes H. The contact holes H having the gate dielectric layer 1 formed on their inner walls are filled with a channel layer 2, thereby forming a lower select transistor LOWER TR of a vertical string.

A plurality of interlayer insulating layers 11 and a plurality of gate electrode conductive layers 12 are alternately formed on the substrate 10 having the lower select transistor LOWER TR formed thereon.

The interlayer insulating layers 11 and the gate electrode conductive layers 12 are selectively etched to form a plurality of contact holes H exposing the substrate 10.

Referring to FIGS. 2A and 2B, a charge blocking layer 13 is formed on inner walls of the contact holes H. Herein, the charge blocking layer 13 prevents charges from passing through a charge trapping layer 14 and moving toward the gate electrodes.

A charge trapping layer 14 is formed on the charge blocking layer 13. Herein, the charge trapping layer 14 traps charges in a deep-level trapping site and serves as a substantial data storage. Generally, the charge trapping layer 14 is formed of nitride.

The contact holes H having the charge blocking layer 13 and the charge trapping layer 14 formed on their inner walls are filled with a tunnel insulating layer 15. Herein, the tunnel insulating layer 15 serves as an energy barrier layer because of tunneling of charges.

Referring to FIGS. 3A and 3B, a center region of the tunnel insulating layer 15 is etched to form channel trenches. The channel trenches are filled with a channel layer to form a plurality of channels 16 protruding from the substrate 10.

An upper select transistor UPPER TR is formed on the resulting structure including the channels 16. Herein, the upper select transistor UPPER TR is formed in the same way as the lower select transistor LOWER TR. Thus, a detailed description of a process for forming the upper select transistor UPPER TR will be omitted for conciseness.

Referring to FIGS. 4A and 4B, a plurality of mask patterns (not shown) are formed on the resulting structure including the upper select transistor UPPER TR. Herein, the mask patterns cover a memory cell (MC) region and extend in a first direction I-I'. Using the mask patterns as an etch barrier, the interlayer insulating layer 11 and the gate electrode conductive layer 12 are etched to form a plurality of gate electrodes 12A. The etched region is filled with an insulating layer 17.

In this way, a plurality of memory cells MC each including the tunnel insulating layer 15, the charge trapping layer 14, the charge blocking layer 13, and the gate electrode 12A surrounding the outer surface of the vertical channel 16 are formed.

Herein, the memory cells MC stacked along the same channel 16 are connected in series between the lower select transistor LOWER TR and the upper select transistor UPPER TR to constitute a string ST. That is, the conventional 3D nonvolatile memory device has a plurality of strings ST arranged vertically from the substrate 10.

Also, the memory cells MC connected to the gate electrode 12A (i.e., the memory cells arranged in the first direction) operate as one page.

According to the conventional art described above, because the plurality of gate electrode conductive layers are stacked in forming memory cells MC, it is possible to provide a 3D nonvolatile memory device with a string structure arranged vertically from a substrate.

However, according to the above structure, the gate electrode conductive layers of the respective layers face each other over wide surface area, and the material of the conductive layers is limited to polysilicon due to process limits. Thus, word-line resistance/capacitance values are large, and the resulting RC delay degrades the performance of the memory device.

Furthermore, according to the conventional art described above, the channels 16 are formed after forming the gate electrode conductive layers 12, the charge blocking layer 13, the charge trapping layer 14, and the tunnel insulating layer 15. That is, because the fabrication process of the 3D nonvolatile memory device is performed in reverse order of that of the planar nonvolatile memory device, the characteristics of the memory device are degraded, as will be described below in more detail.

First, the layer quality of the tunnel insulating layer 15 is degraded because the tunnel insulating layer 15 is formed at the last stage and the channel trenches are formed by etching the center region of the tunnel insulating layer 15.

Second, a high-temperature monocrystalline layer is difficult to grow because the charge blocking layer 13, the charge trapping layer 14, and the tunnel insulating layer 15 may be damaged during the process of forming the channel layer within the channel trenches and thus the channels 16 of monocrystalline silicon may fail to be formed. Therefore, the current flow in the channels 16 is lowered and the uniformity of threshold voltage distribution is degraded.

Meanwhile, the conventional 2D memory device has one drain select line per memory block. However, the 3D memory device has a plurality of memory cells stacked vertically from a substrate. Therefore, if the 3D memory device has one drain select line per memory block like the conventional memory device, it has a limitation in performing read/write operations by controlling the plurality of memory cells.

SUMMARY OF THE INVENTION

An embodiment of the present invention is directed to provide a 3D nonvolatile memory device having a plurality of strings stacked by stacking a plurality of memory cells on the sidewall of a channel structure with a plurality of channel layers stacked, and a method for fabricating the 3D nonvolatile memory device.

Another embodiment of the present invention is directed to provide a 3D nonvolatile memory device including a plurality of drain select transistors connected respectively to a plurality of channel layers, and a method for fabricating the 3D nonvolatile memory device.

Another embodiment of the present invention is directed to provide a 3D nonvolatile memory device having a channel, a tunnel insulating layer, a charge trapping layer, a charge blocking layer, and a gate electrode formed sequentially, and a method for fabricating the 3D nonvolatile memory device.

In accordance with an aspect of the present invention, there is provided a three-dimensional nonvolatile memory device, including: a plurality of channel structures extending in parallel in a first direction and comprising a plurality of channel layers that are alternately stacked with a plurality of interlayer insulating layers over a substrate; a plurality of memory cells stacked along sidewalls of the channel structures and arranged in the first direction and a second direction crossing the first direction; and a plurality of word lines extending in parallel in the second direction and connected to the memory cells arranged in the second direction.

In accordance with another aspect of the present invention, there is provided a method for fabricating a three-dimensional nonvolatile memory, the method including: stacking a plurality of channel layers alternately with a plurality of interlayer insulating layers over a substrate; etching the channel layers and the interlayer insulating layers to form a plurality of channel structures extending in parallel in a first direction; forming a plurality of memory cells stacked along the sidewalls of the channel structures and arranged in the first direction and a second direction crossing the first direction; and forming a plurality of word lines extending in parallel in the second direction and connected to the memory cells arranged in the second direction.

DESCRIPTION OF SPECIFIC EMBODIMENTS

Figure 1A:
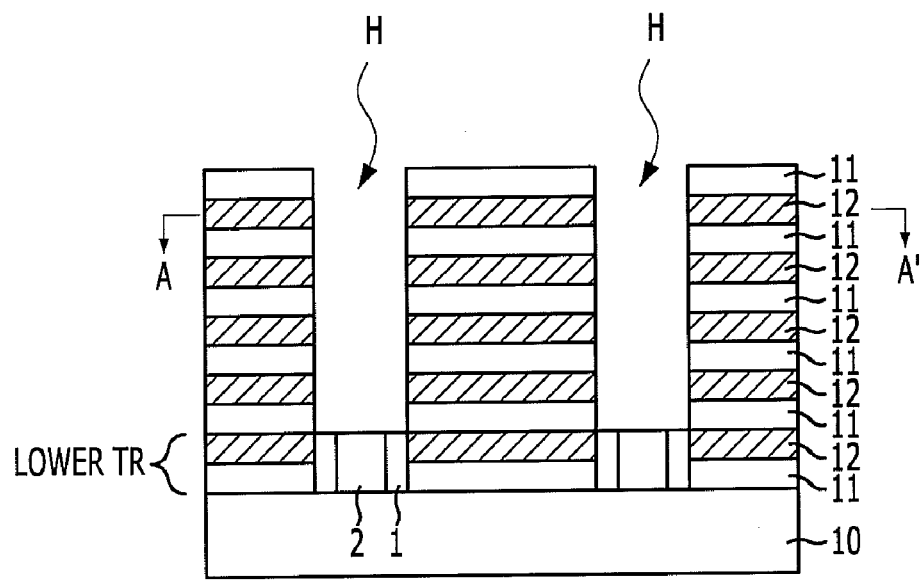
FIGS. 1A to 4B illustrate a conventional process for fabricating a 3D nonvolatile memory device.
Figure 1B:
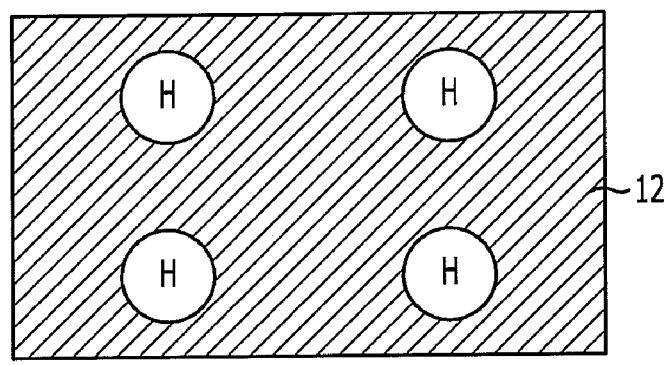
Figure 2A:
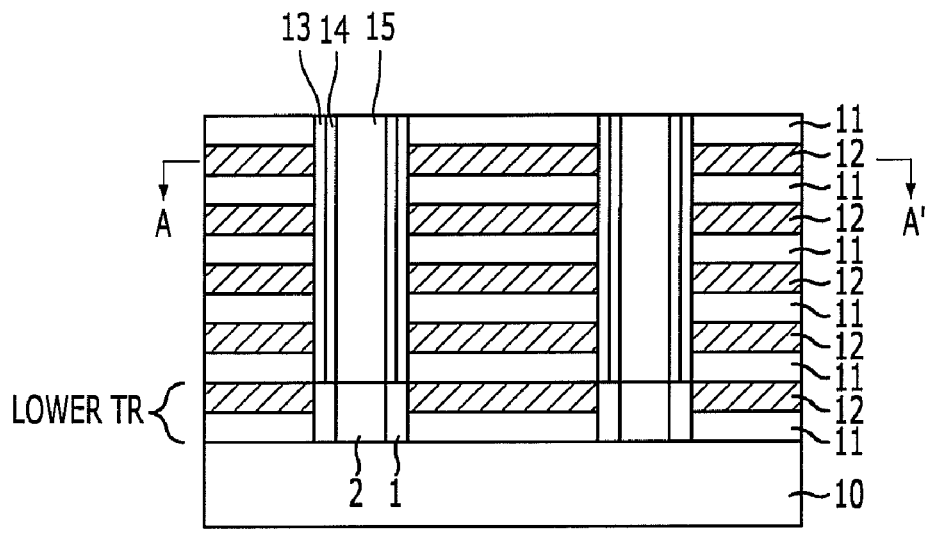
Figure 2B:
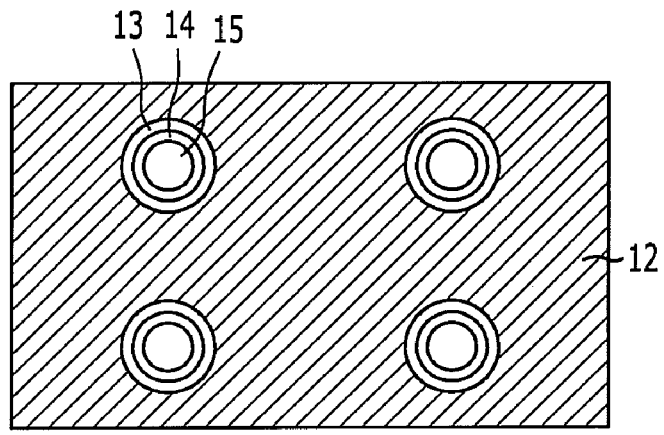
Figure 3A:
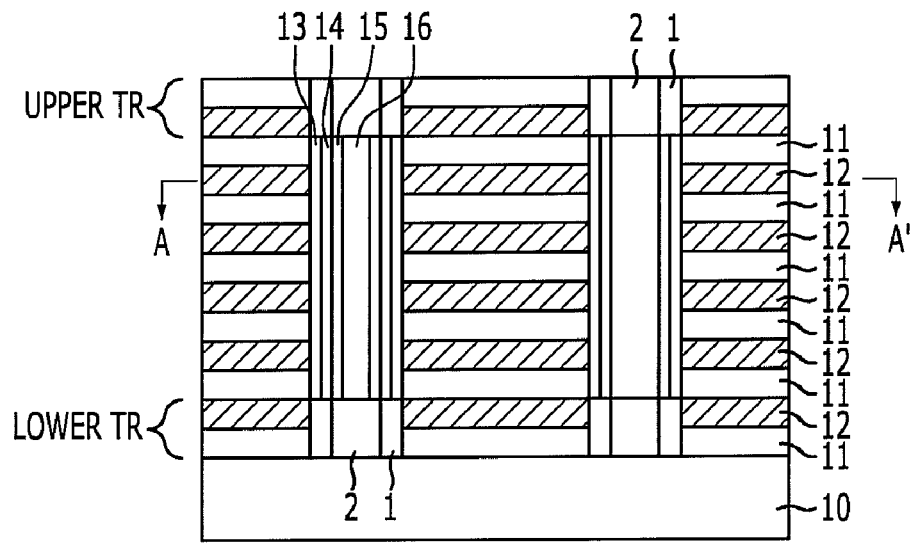
Figure 3B:
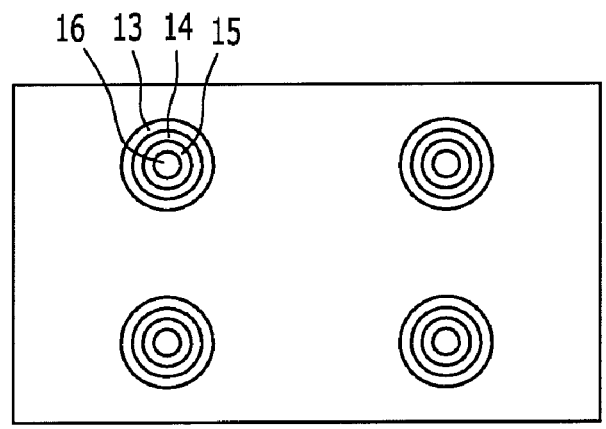
Figure 4A:
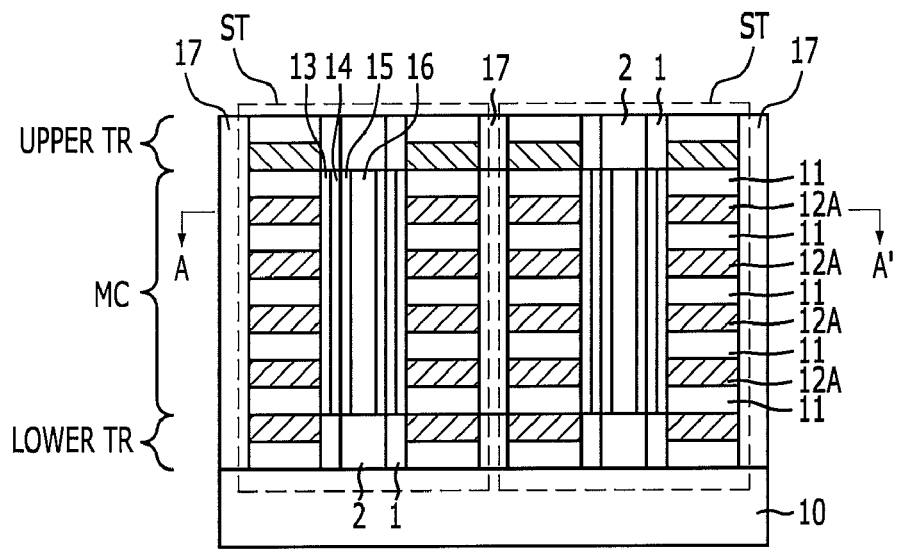
Figure 4B:
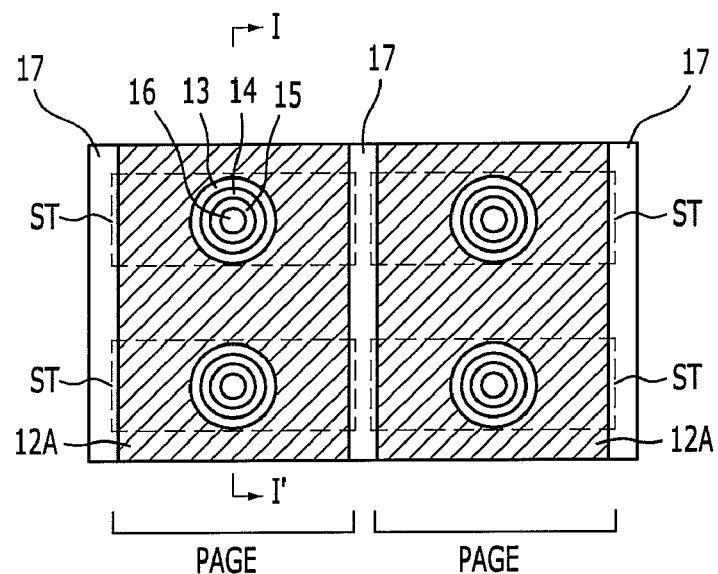

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Figure 5A:
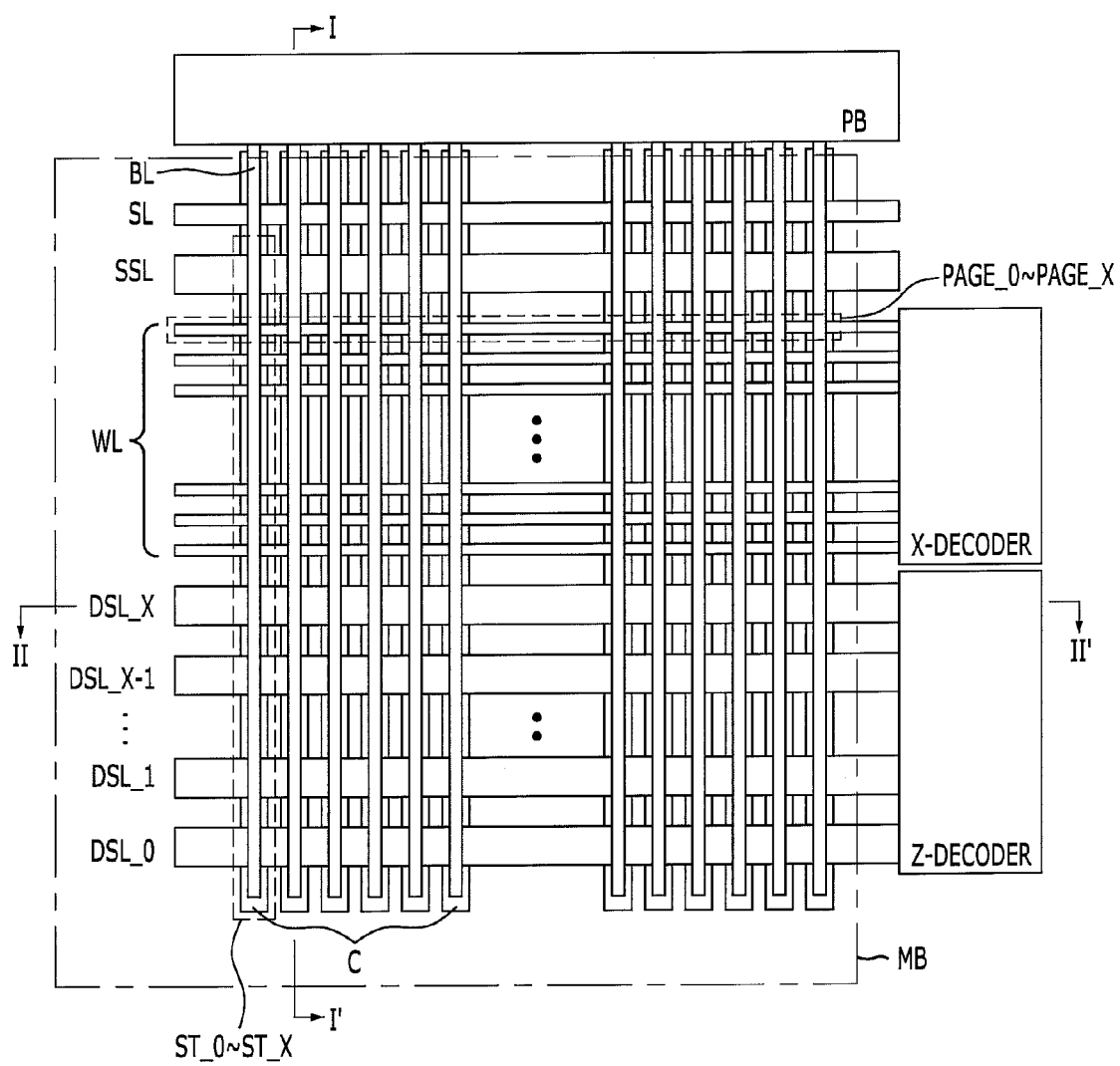
FIG. 5A is a layout diagram of a 3D nonvolatile memory device in accordance with an embodiment of the present invention.

FIG. 5A is a layout diagram of a 3D nonvolatile memory device in accordance with an embodiment of the present invention.

Referring to FIG. 5A, a plurality of bit lines BL and a plurality of word lines WL are provided on a substrate. Herein, the plurality of bit lines BL extend in parallel in a first direction I-I', and the plurality of word lines WL extend in parallel in a second direction II-II' crossing the first direction I-I'.

The bit line BL is used to input/output data. Although not shown in FIG. 5A, a plurality of strings ST_0 to ST_X are stacked and connected with respect to one bit line BL. Also, the plurality of strings ST connected to the plurality of bit lines BL are connected in parallel to a source line SL to constitute a memory block MB.

The word line WL is used to select and activate a desired memory cell. Although not shown in FIG. 5A, a plurality of pages PAGE_0 to PAGE_X are stacked and connected with respect to one word line WL, and the desired pages are selected by a plurality of drain select lines DSL_0 to DSL_X formed respectively on a plurality of channel layers.

Herein, the plurality of bit lines BL are connected to a page buffer PB, and the page buffer PB decodes an input address to control the corresponding bit line BL. Also, the plurality of word lines WL are connected to an X-decoder, and the X-decoder decodes an input address to control the corresponding word line WL.

Also, a plurality of source select lines SSL extending in parallel in the second direction are provided on the substrate, and a source line SL is provided in a junction region between the source select lines SSL.

Also, a plurality of drain select lines DSL_0 to DSL_X extending in parallel in the second direction are provided on the substrate. In accordance with the present invention, because drain select transistors are formed respectively on a plurality of channel layers, a plurality of drain select lines DSL are provided to connect to the drain select transistors formed on the same layer. That is, a plurality of drain select lines DSL_0 to DSL_X corresponding to the number of the stacked channel layers are provided per memory block MB. For example, an X number of drain select lines DSL_0 to DSL_X are provided for a 3D nonvolatile memory device with an X number of stacked channel layers.

Herein, the plurality of drain select lines DSL_0 to DSL_X are connected to a Z-decoder, and the Z-decoder decodes an input address to control the corresponding drain select line DSL.

Figure 5B:
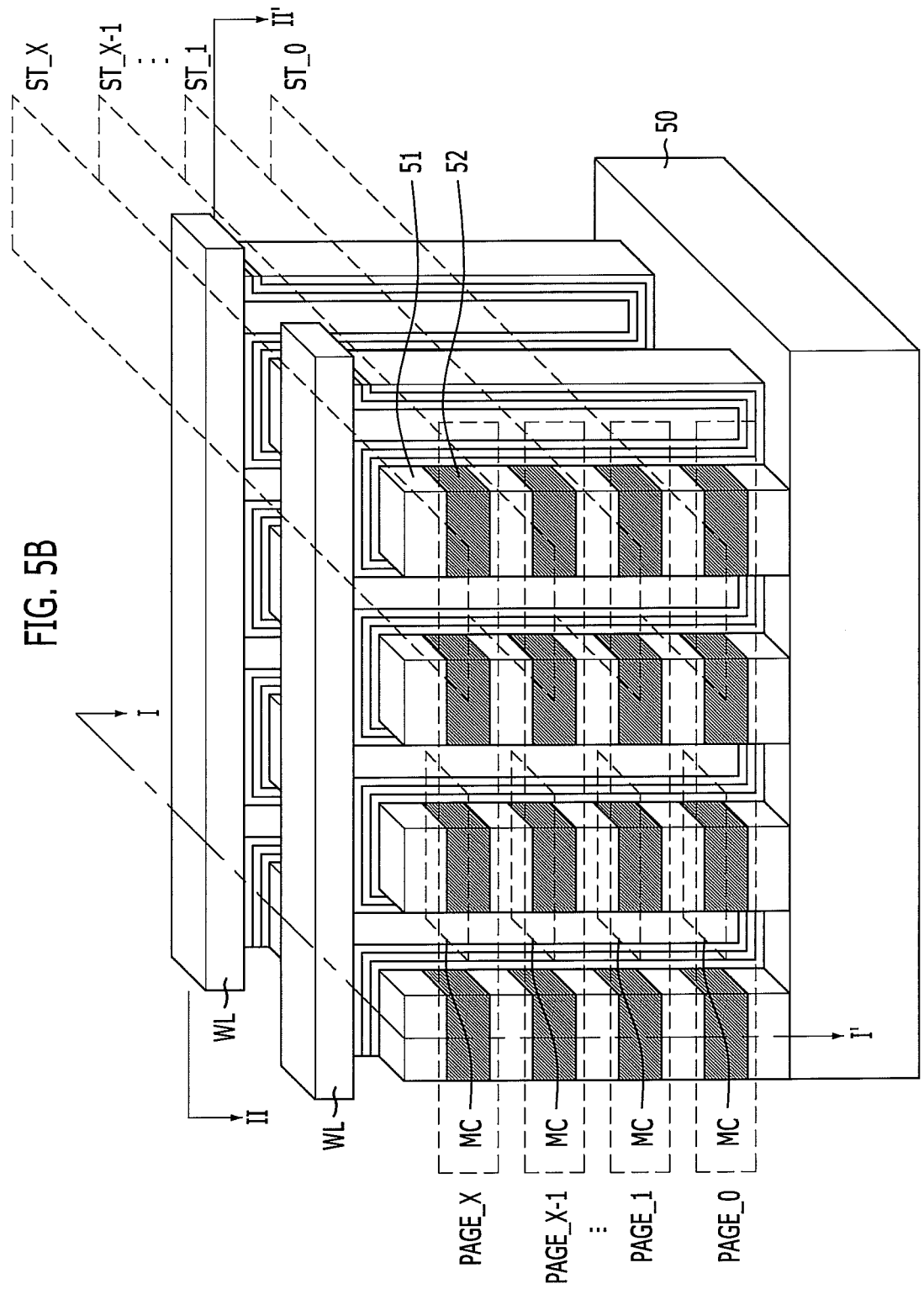
FIG. 5B is a perspective view of a 3D nonvolatile memory device in accordance with an embodiment of the present invention.

FIG. 5B is a perspective view of a 3D nonvolatile memory device in accordance with an embodiment of the present invention. For the convenience of description, the illustration is focused on a channel structure C (as also shown in FIG. 6A), memory cells MC, and word lines WL, and the other layers are not illustrated for conciseness.

Referring to FIG. 5B, a 3D nonvolatile memory device in accordance with an embodiment of the present invention includes a plurality of channel structures C, a plurality of memory cells MC, and a word line WL. Herein, the plurality of channel structures C extend in parallel in the first direction I-I'. The plurality of memory cells MC are stacked along the sidewalls of the plurality of channel structures C. The word line WL is connected to the gate electrodes of the memory cells MC arranged in a second direction II-II' crossing the first direction I-I'.

Figure 6A:
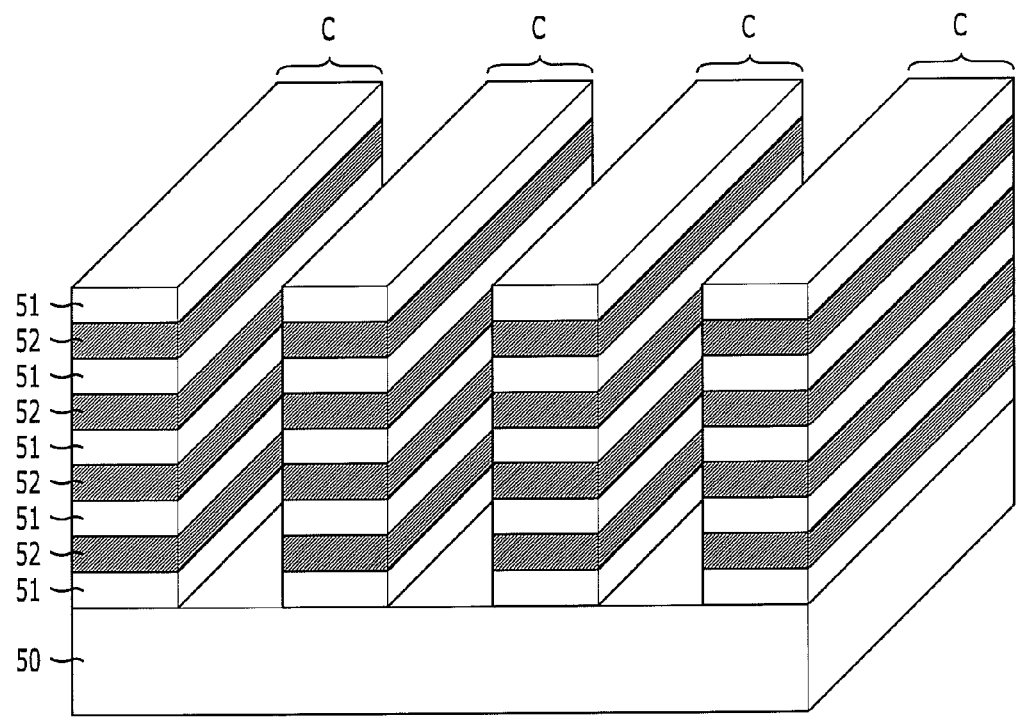
FIGS. 6A to 9B illustrate a process for fabricating a 3D nonvolatile memory device in accordance with an embodiment of the present invention.

Herein, the channel structure C includes a plurality of channel layers 52 and a plurality of interlayer insulating layers 51 (as also shown in FIG. 6A) that are stacked alternately. The number of the strings ST sharing one bit line BL is determined according to the number of the stacked channel layers 52. For example, if an X number of channel layers are stacked, an X number of stacked strings ST share one bit line BL.

The plurality of memory cells MC stacked along the sidewalls of the channel structures C are arranged in the first direction and the second direction. Herein, the plurality of memory cells MC of the same layer, which are arranged in the first direction to share the channel layer 52, are connected in series between a source select transistor and a drain select transistor to constitute a string (ST) structure.

According to the above structure, a plurality of strings ST stacked from a substrate 50 (i.e., a plurality of strings ST_0 to ST_X stacked along the same channel structure C) are connected to the same bit line BL.

The word line WL is connected to the gate electrodes of the memory cells MC arranged in the second direction. Herein, among the plurality of memory cells MC sharing the word line WL, the memory cells MC formed on the same layer constitute one page. That is, one word line WL is connected to a plurality of pages PAGE_0 to PAGE_X, and selects a desired page in a read/write operation by the on/off of the drain select transistor formed on each layer of the channel layer.

Even in the case of the memory cells MC formed on the same layer, the pages may be divided by the connected bit lines. The page connected to an even bit line may operate as an even page, and the page connected to an odd bit line may operate as an odd page. For the convenience of description, the even page and the odd page are illustrated by assuming that there are substantially no functional differences.

Figure 5C:
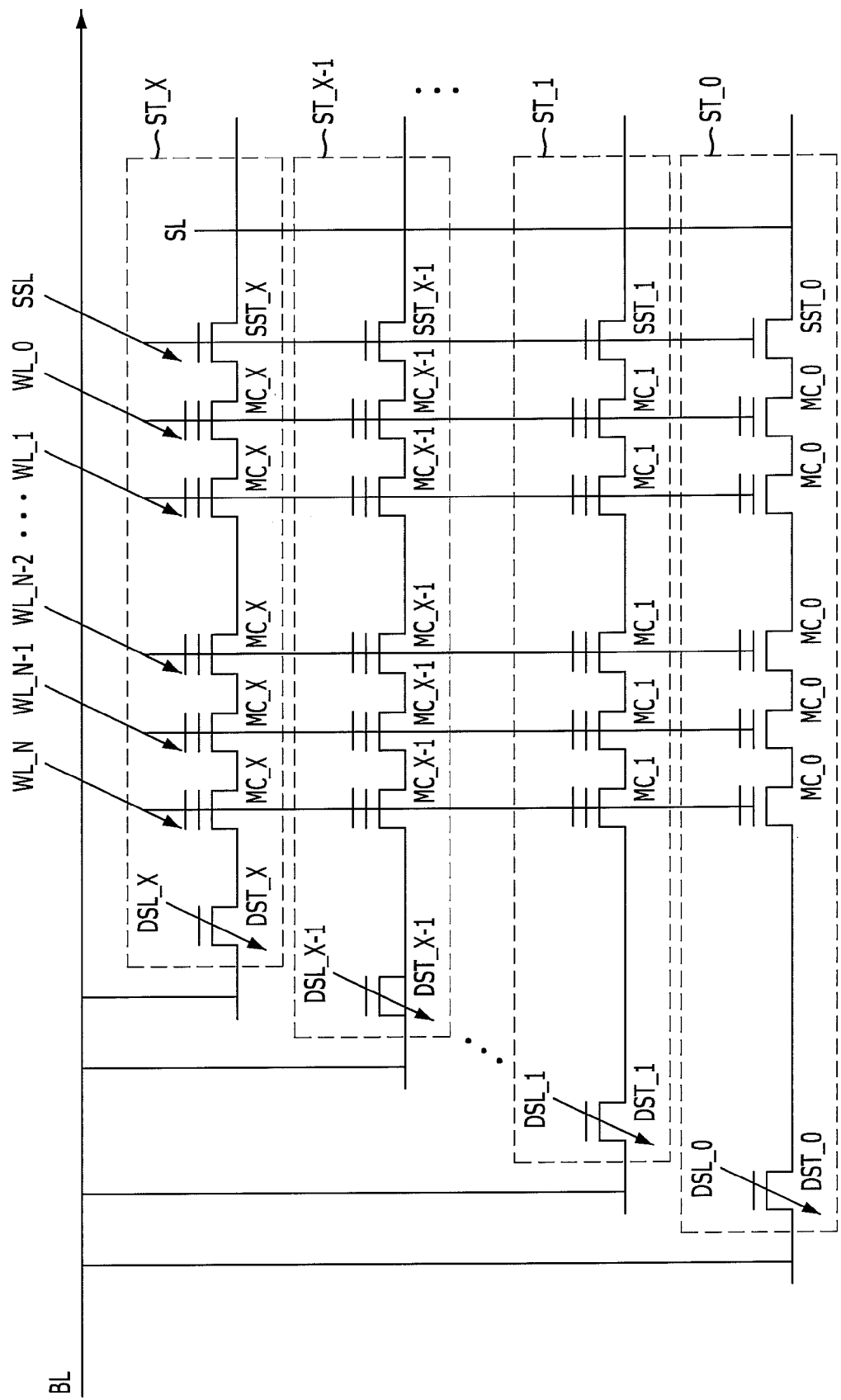
FIG. 5C is a circuit diagram illustrating a portion of a cell array of a 3D nonvolatile memory device in accordance with an embodiment of the present invention.

FIG. 5C is a circuit diagram illustrating a portion of a cell array of a 3D nonvolatile memory device in accordance with an embodiment of the present invention. For the convenience of description, the illustration is focused on a plurality of strings ST connected to one bit line BL.

Referring to FIG. 5C, a plurality of strings ST_0 to ST_X are connected with respect to one bit line BL, and the plurality of strings ST_0 to ST_X are connected respectively to a plurality of drain select lines DSL_0 to DSL_X. Thus, in a read/write operation, the drain select line DSL connected to a desired page is activated and the other drain select lines DSL are deactivated, thereby selecting the desired page.

FIGS. 6A to 9B illustrate a process for fabricating a 3D nonvolatile memory device in accordance with an embodiment of the present invention. Herein, Figures "A" are perspective views of intermediate resulting structures, and Figures "B" are plan views thereof.

Figure 6B:
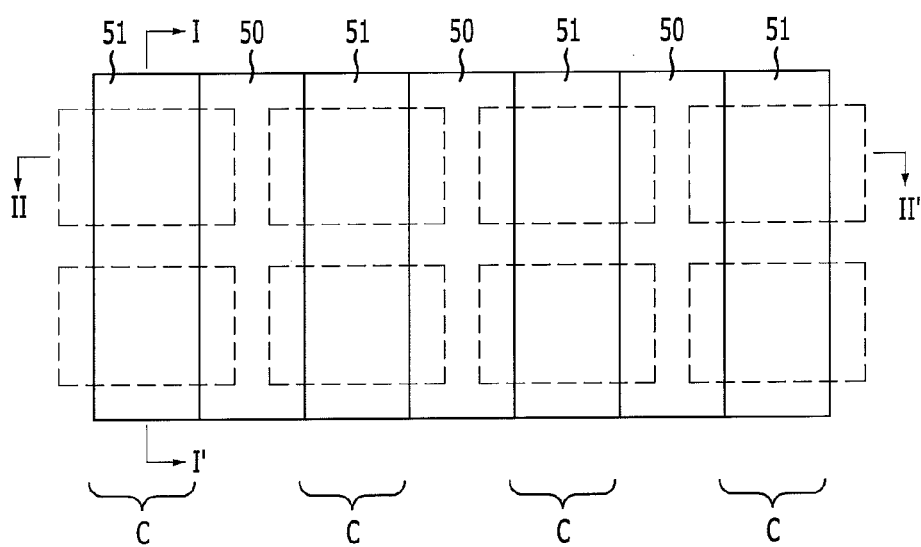

Referring to FIGS. 6A and 6B, a plurality of interlayer insulating layers 51 and a plurality of channel layers 52 are alternately stacked on a substrate 50 where required structures such as wells, shallow trench isolation (STI) layers of a peripheral circuit region, and high voltage (HV) transistors are formed.

The interlayer insulating layer 51 serves to isolate the stacked channel layers 52 from each other. The interlayer insulating layer 51 may be formed to a sufficient thickness of an oxide layer, a nitride layer, or a stack thereof.

The channel layer 52 serves to form a channel of a memory cell. The channel layers 52 are stacked as many as the number of memory cells to be stacked, i.e., the number of strings ST to be stacked. Herein, the strings ST may be stacked plural times in a distributed manner. For example, if 20 strings ST are to be stacked, 4 strings ST are stacked at a time and this process is repeated 5 times, thereby stacking 20 strings ST.

The channel layer 52 may include a monocrystalline silicon layer or a polysilicon layer doped with p-type or n-type impurities, thereby forming an NMOS or PMOS memory cell. The memory cell formed using the channel layer 52 may operate in a depletion mode or an enhancement mode. In particular, when the channel layer 52 is formed of a monocrystalline silicon layer, the current flow in the channel and the uniformity of threshold voltage distribution can be improved.

Impurity doping concentrations may be controlled such that the plurality of channel layers 52 have different impurity concentrations. In an exemplary embodiment, the plurality of interlayer insulating layers 51 and the plurality of channel layers 52 may be alternately deposited on the substrate 50. In another exemplary embodiment, a stack structure of interlayer insulating layers 51 and channel layers 52 may be fabricated in a separate manner and the stack structure may be attached on the substrate 50.

The stacked interlayer insulating layers 51 and channel layers 52 are etched to form a plurality of channel structures C extending in parallel in the first direction I-I'. In this way, a linear channel structure C with stacked channel layers 52 is formed, so that memory cells stacked along the sidewall of the channel structure C can be formed in the subsequent process. In FIG. 6B, a region denoted by a dotted line corresponds to a region for a memory cell.

Although FIGS. 6A and 6B illustrate that the sidewall of the channel structure C is formed vertically from the substrate, this is merely for the convenience of description, to which the present invention is not limited. Also, the stacked interlayer insulating layers 51 and channel layers 52 may be etched such that the lower width of the channel structure C is larger than the upper width. The angle between the substrate 50 and the sidewall of the channel structure C may range from approximately 90° to approximately 135°.

In this case, the channel width is increased toward the bottom of the channel structure C, so that it is possible to compensate for a current difference due to a length difference between the strings ST formed on the respective layers. Referring to FIG. 11B, if drain select transistors are formed stepwise, the lower string ST may be longer than the upper string ST, so that a channel current may be reduced. However, the current reduction may be compensated by increasing the channel width toward the bottom of the channel structure C.

Also, the amount of current flow in the string ST of each layer may be controlled by adjusting the impurity doping concentration of each layer.

An ion implantation process may be performed for the resulting structure with the channel structure C in order to control the threshold voltage of a memory cell formed through the subsequent process.

Figure 7A:
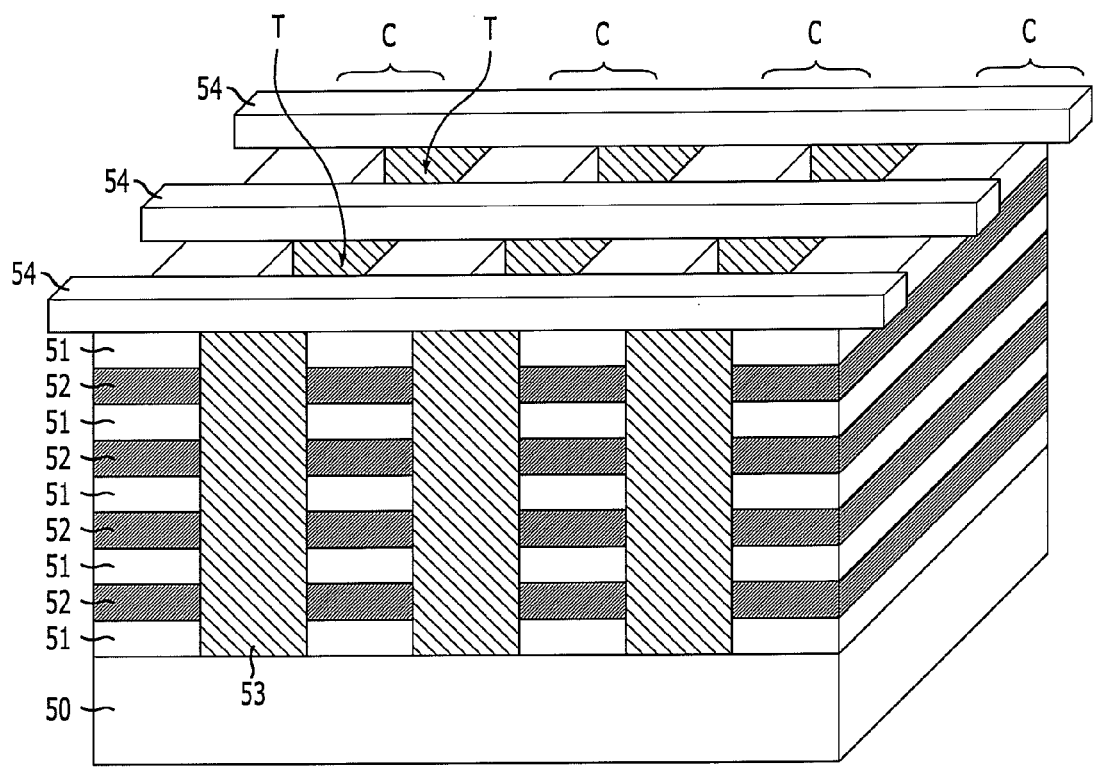
Figure 7B:
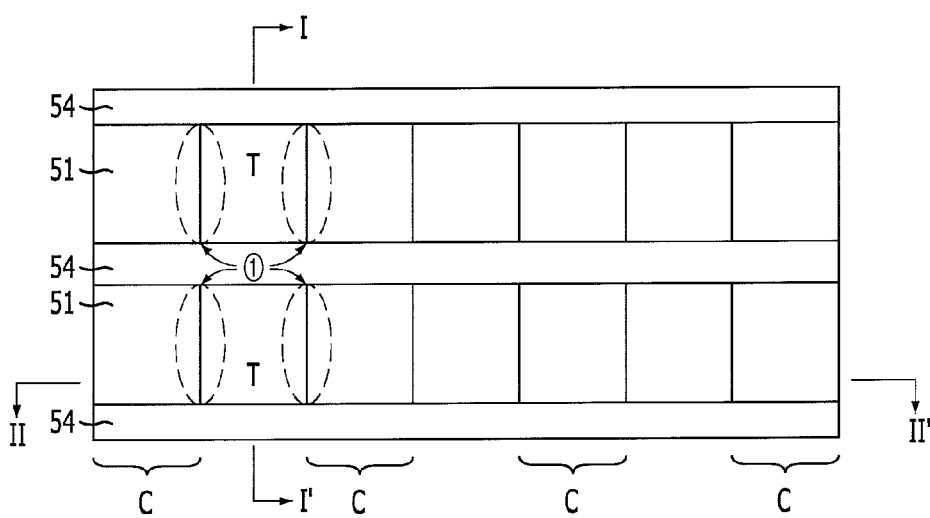

Referring to FIGS. 7A and 7B, a gap region between the channel structures C is filled with an insulating layer 53, and a plurality of hard mask patterns 54 are formed on the resulting structure including the insulating layer 53. Herein, the plurality of hard mask patterns 54 expose a region for a memory cell and extend in parallel in the second direction. The insulating layer 53 may include an oxide layer with a high wet-etching rate, for example, a polysilazane (PSZ) layer.

By using the hard mask patterns 54 as an etch barrier, the insulating layer 53 is etched to form trenches T exposing the substrate 50. In this way, the trenches T are formed to expose the sidewall of the channel structure C at certain intervals (see a reference numeral "①").

Figure 8A:
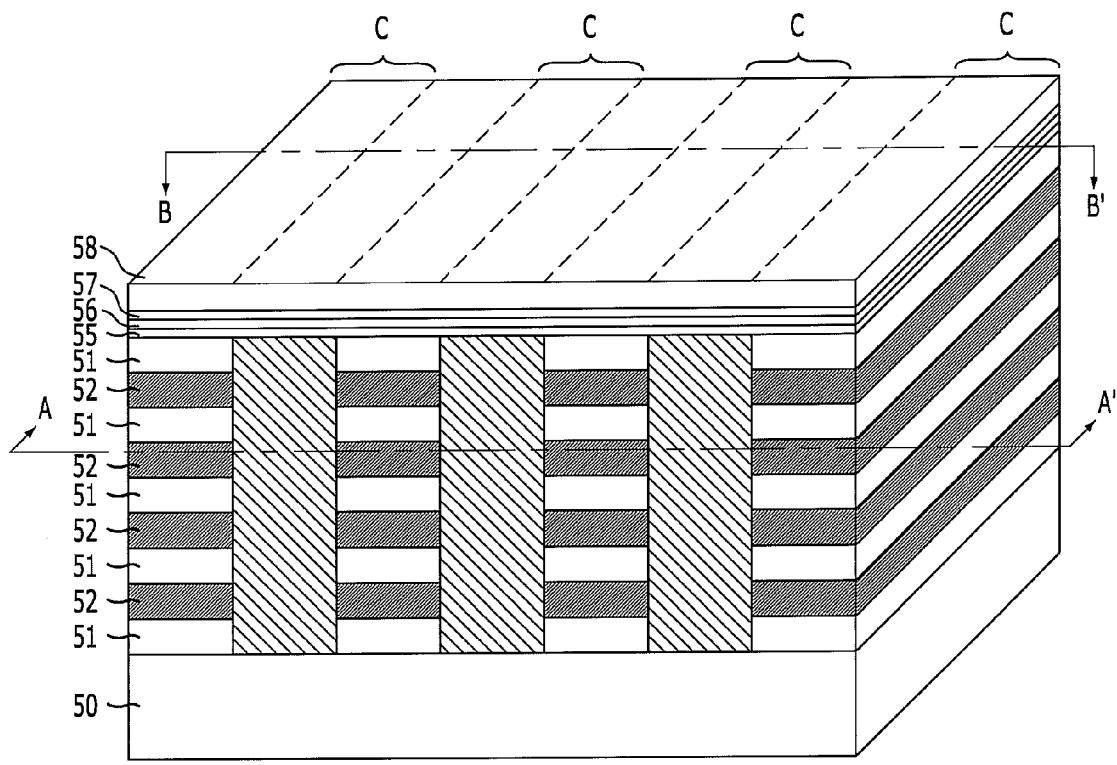
Figure 8B:
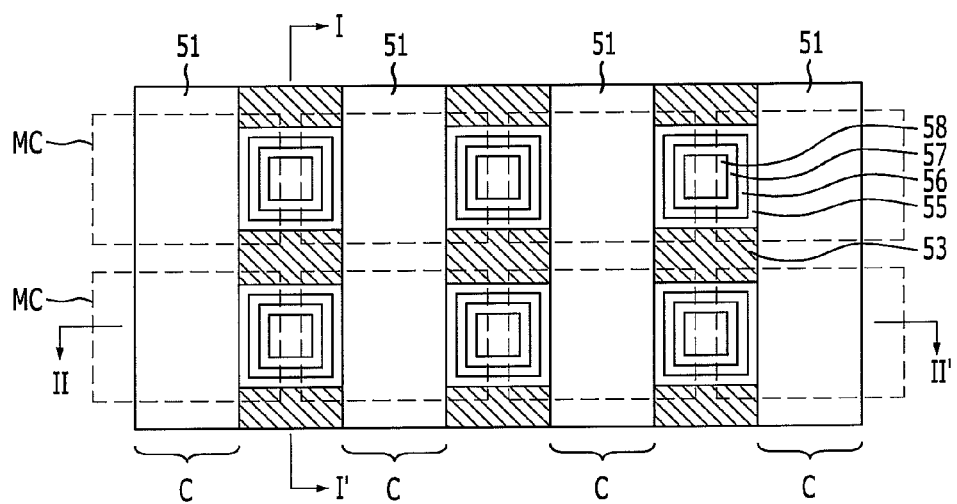
Figure 8C:
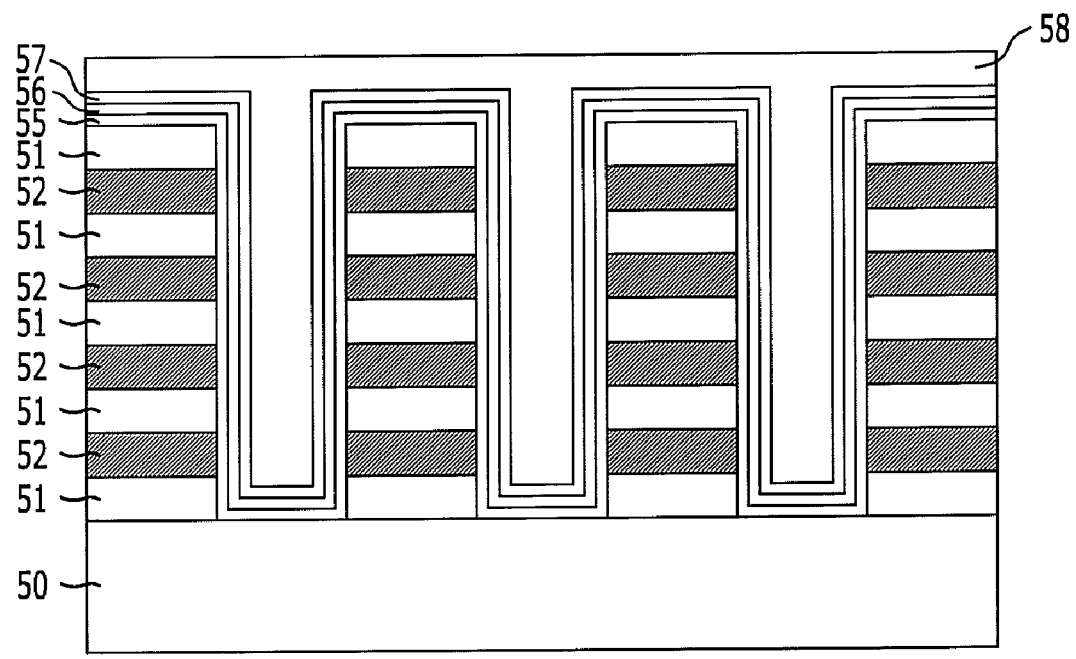

FIGS. 8A to 8C illustrate the intermediate resulting structure including a plurality of memory cells MC that are stacked along the sidewalls of the channel structures C and are arranged in the first direction and the second direction. Specifically, FIG. 8B is a plan view at a height A-A' of FIG. 8A and FIG. 8C is a cross-sectional view taken along a line B-B' of FIG. 8A. Hereinafter, a detailed description will be given of a process for forming a memory cell MC in accordance with an embodiment of the present invention.

Referring to FIGS. 8A to 8C, a tunnel insulating layer 55, a charge trapping layer 56, and a charge blocking layer 57 are sequentially formed on the resulting structure including the trenches T.

The tunnel insulating layer 55 may include an oxide layer. The charge trapping layer 56 may include a nitride layer. The charge blocking layer 57 may include a silicon oxide layer, a metal oxide layer, or a stacked layer thereof. The metal oxide layer may include an $Al_2O_3$ layer, an $HfO_2$ layer, an $LaO_x$ layer, a $TiO_x$ layer, a $Ta_2O_5$ layer, or a stacked layer thereof.

A gate electrode conductive layer 58 is formed over the resulting structure including the tunnel insulating layer 55, the charge trapping layer 56, and the charge blocking layer 57. Consequently, the trenches T including the tunnel insulating layer 55, the charge trapping layer 56, and the charge blocking layer 57 are filled with the gate electrode conductive layer 58.

Herein, if the trenches T are all filled with the tunnel insulating layer 55, the charge trapping layer 56, and the charge blocking layer 57, a portion of the center of the charge blocking layer 57 may be etched to form a hole for the gate electrode conductive layer 58, and the hole may be filled with the gate electrode conductive layer 58.

The gate electrode conductive layer 58 may include an n-type polysilicon layer, a p-type polysilicon layer, or a metal layer. The metal layer may be formed of TiN, TaN, TaCN, TiSiN, TaSiN, or precious metal.

Consequently, a plurality of memory cells MC, stacked along the sidewalls of the channel structures C, are formed. Herein, the stacked memory cells MC are arranged in the first direction and the second direction. That is, pillars of the stacked memory cells MC are arranged in the first direction and the second direction.

If the strings ST are stacked plural times in a distributed manner as described above, a planarization process may be performed until the surfaces of the channel structures C are exposed, after the formation of the gate electrode conductive layer 58.

In the present embodiment, the insulating layer 53 formed between the channel structures C is etched to form the trenches T, and the trenches T are filled with the tunnel insulating layer 55, the charge trapping layer 56, and the charge blocking layer 57 to form the memory cell MC. However, this is merely an exemplary embodiment, and the memory cell MC may be formed in various ways.

For example, a tunnel insulating layer, a charge trapping layer, a charge blocking layer, and a gate electrode conductive layer may be sequentially formed over the resulting structure including the channel structures C; they may be selectively etched to form a memory cell, and the etched region may be filled with an insulating layer.

Figure 9A:
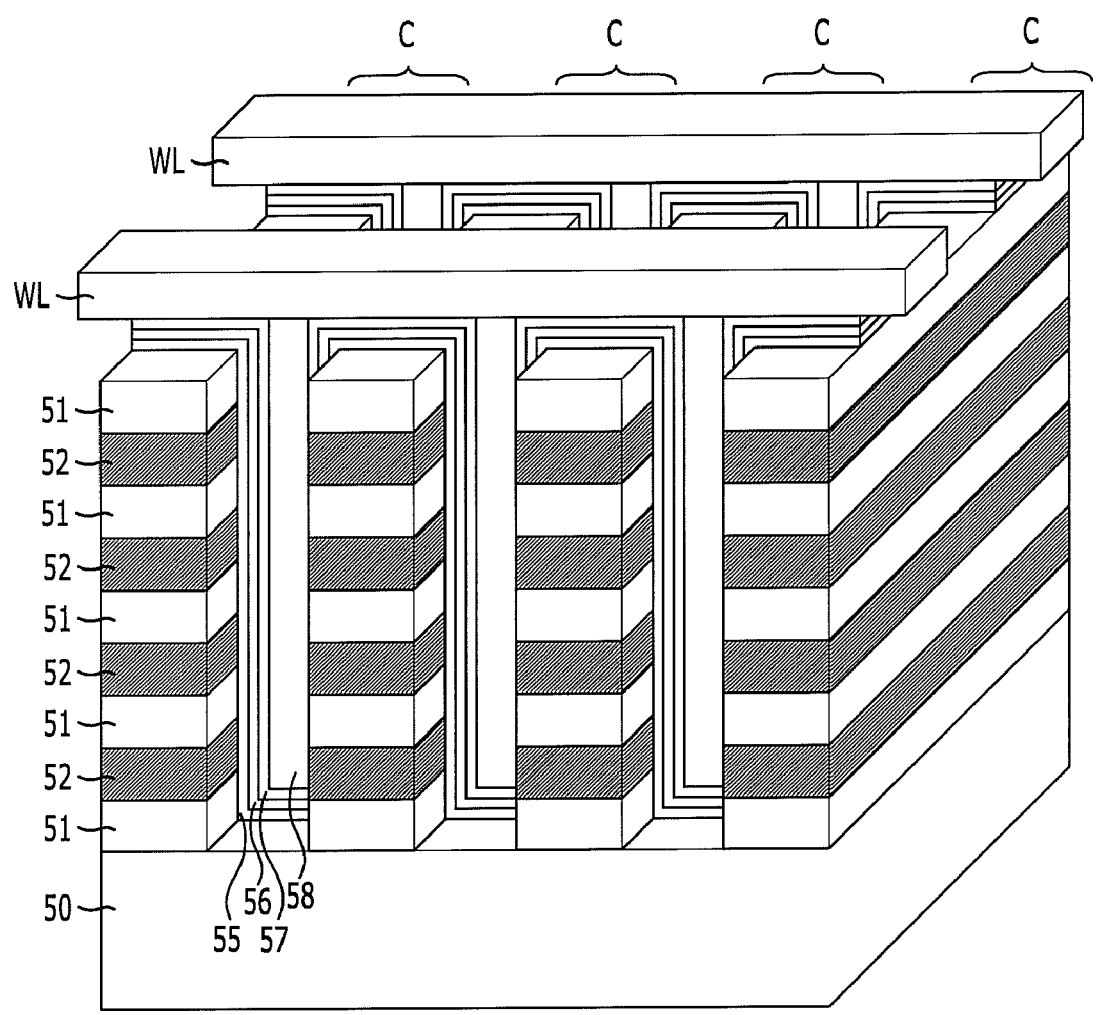
Figure 9B:
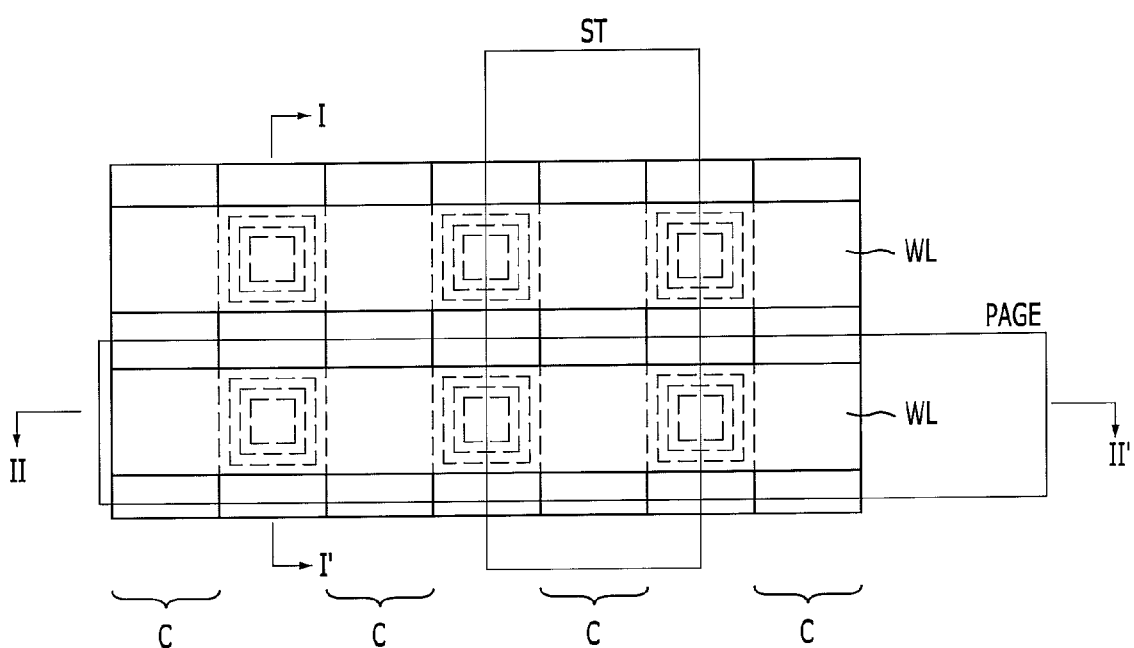

FIGS. 9A and 9B illustrate the intermediate resulting structure including a plurality of word lines WL. For the convenience of description, the illustration of the insulating layer 53 is omitted and the illustration shows the sectional surfaces of the layers constituting the memory cell MC.

Referring to FIGS. 9A and 9B, a word line conductive layer is formed over the resulting structure including the memory cells MC. A low-resistance material may be additionally deposited on the word line conductive layer. A tungsten silicide layer may be additionally deposited on the word line conductive layer.

The word line conductive layer is selectively etched to form word lines WL. At this point, the gate electrode conductive layer 58, the charge blocking layer 57, the charge trapping layer 56, and the tunnel insulating layer 55, formed on the channel structures C, may be patterned simultaneously.

Consequently, a plurality of word lines WL are formed in such a way that they are connected to the gate electrodes of the memory cells MC, arranged in the second direction, to extend in the second direction.

According to the above structure, the memory cells MC arranged in the first direction and sharing a channel layer 52 are connected in series between a drain select transistor and a source select transistor to form a string (ST) structure. Also, the memory cells MC arranged in the second direction are connected to the same word line WL to constitute a page.

A source/drain ion implantation process and a re-oxidation process may be performed after removal of the insulating layer 52.

In accordance with the present invention described above, the channel structures C with the stacked channel layers 52 are used to form the memory cells MC, thereby making it possible to fabricate the 3D nonvolatile memory device with the stacked strings ST.

According to the above structure, because the trenches are filled with the gate electrode conductive layer in the form of a pillar, the capacitance value can be greatly reduced in comparison with the conventional method. Also, because the low-resistance material layer can be additionally formed for the formation of the word lines and the gate electrodes, the word-line resistance value can be greatly reduced in comparison with the conventional method. Thus, the RC delay can be reduced and the performance of the memory device can be improved.

Also, because the memory cells MC are stacked along both sidewalls of the channel structures C, the plurality of memory cells MC sharing the channel layer 52 and arranged in the first direction constitute one string ST; and because the strings ST are stacked, the integration density of the memory device can be improved.

Also, because the tunnel insulating layer 55, the charge trapping layer 56, and the charge blocking layer 44 can be sequentially formed after the formation of the channel layer 52, the layer quality of the tunnel insulating layer 55 can be improved. Also, because the channel layer 52 is formed of monocrystalline silicon, the current flow in the channel and the uniformity of threshold voltage distribution can be improved.

Also, the memory cell MC can operate in a depletion mode or an enhancement mode. In particular, in accordance with the present invention, because the memory cells MC with a data storage layer are formed at both sides of the channel layer, the channel can be easily controlled in the depletion mode operation and the amount of current flow in the channel can be increased in the enhancement mode operation.

Figure 10:
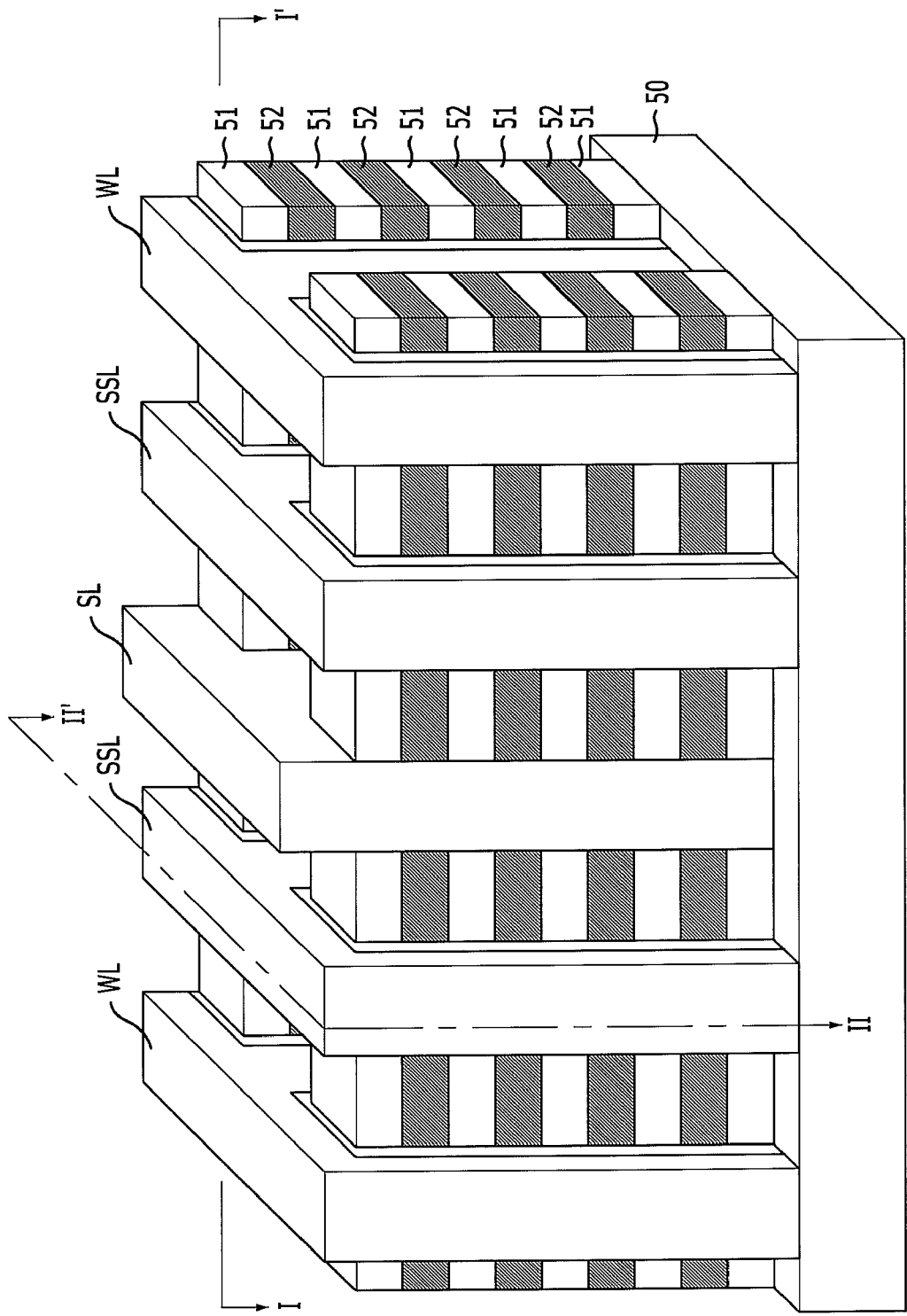
FIG. 10 is a perspective view of a 3D nonvolatile memory device having source select lines and source lines formed in accordance with an embodiment of the present invention.

FIG. 10 is a perspective view of a 3D nonvolatile memory device having source select lines SSL and source lines SL formed in accordance with an embodiment of the present invention.

Referring to FIG. 10, a 3D nonvolatile memory device in accordance with an embodiment of the present invention includes a plurality of source select lines SSL and a linear source line SL. Herein, the source select lines SSL extend in parallel in the second direction, and the linear source line SL extends between the source select lines SSL in the second direction.

FIG. 10 illustrates the case where the source select lines SSL are formed simultaneously with the formation of a memory cell MC and word lines WL. In this case, the source select lines SSL are formed in a gap region between channel structures C in the same overall structure including the memory cell MC and the word lines WL. A source select transistor may be formed for each of a plurality of channel layers 52, which will be described later in detail with reference to FIGS. 11A to 11C.

The source line SL is formed by etching a source line (SL) region between the source select lines SSL to form a source line trench and filling the source line trench with a conductive layer.

The source line trench may be formed to expose a substrate 50 of the source line (SL) region or to expose the lowermost channel layer 52.

Also, n-type impurity ions may be implanted for formation of a junction after the etching of the source line (SL) region, and the conductive layer may include a polysilicon layer.

In particular, the source line conductive layer may include an n-type polysilicon layer. The source line conductive layer may be formed by forming a silicon layer by epitaxial growth and doping the silicon layer with n-type impurities. Alternatively, the source line conductive layer may be formed of barrier metal (BM) or tungsten (W).

Figure 11A:
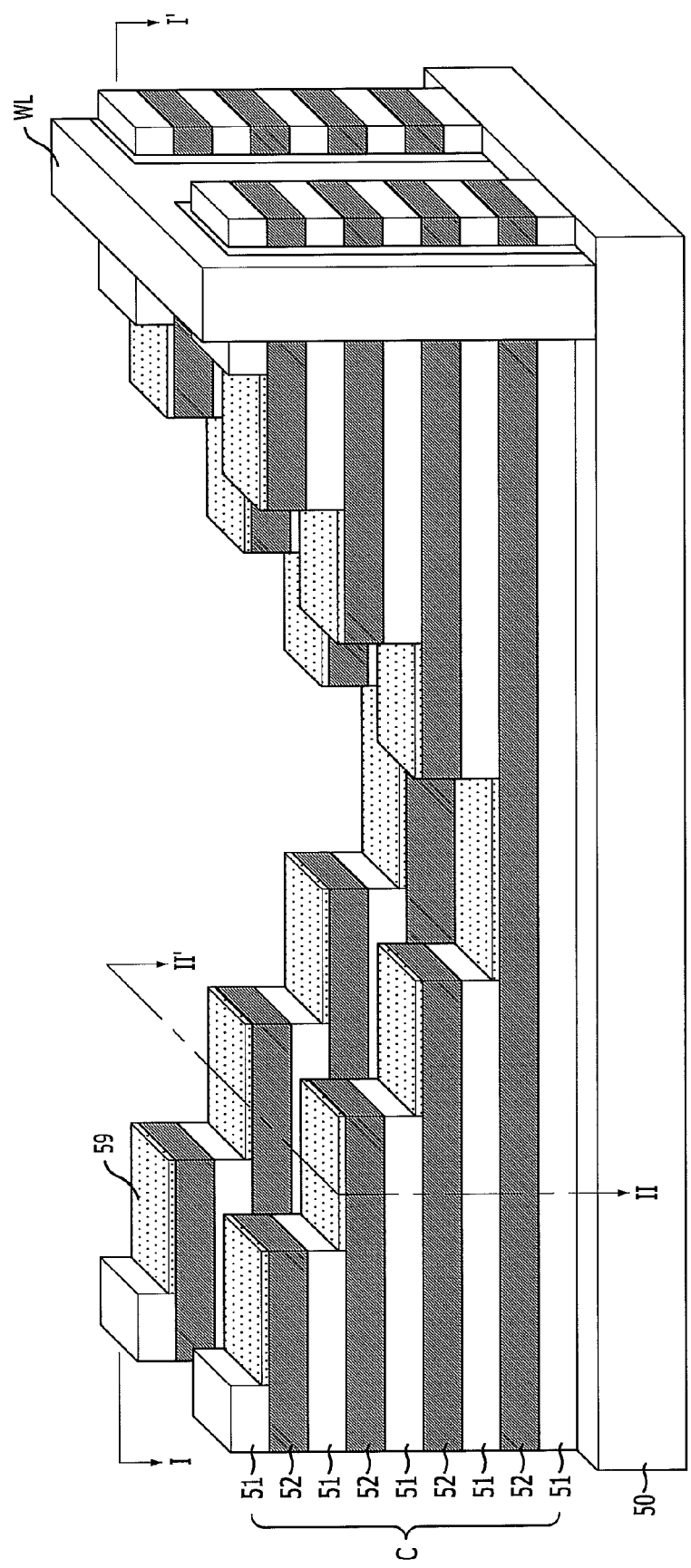
FIGS. 11A to 11C are perspective views of a 3D nonvolatile memory device having drain select lines, drain contact plugs, and bit lines formed in accordance with an embodiment of the present invention.
Figure 11B:
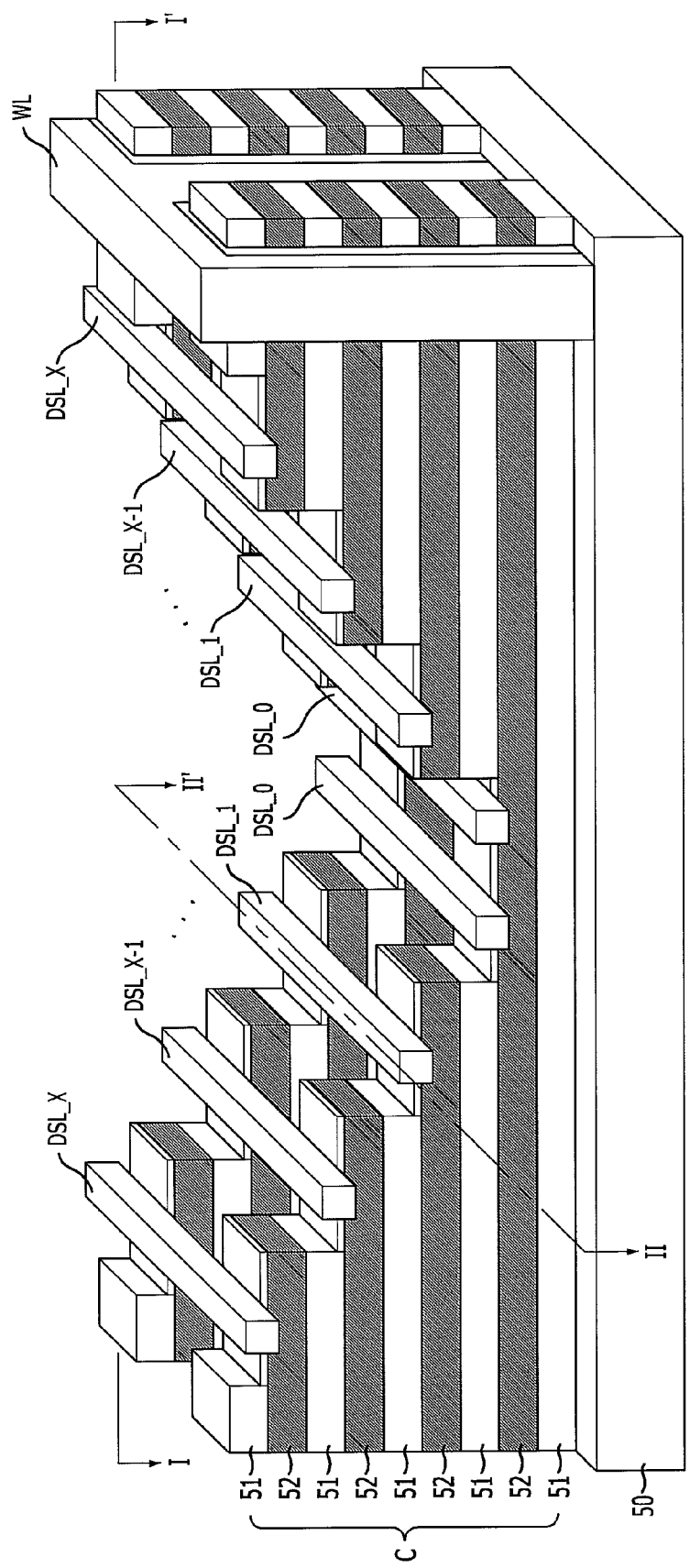
Figure 11C:
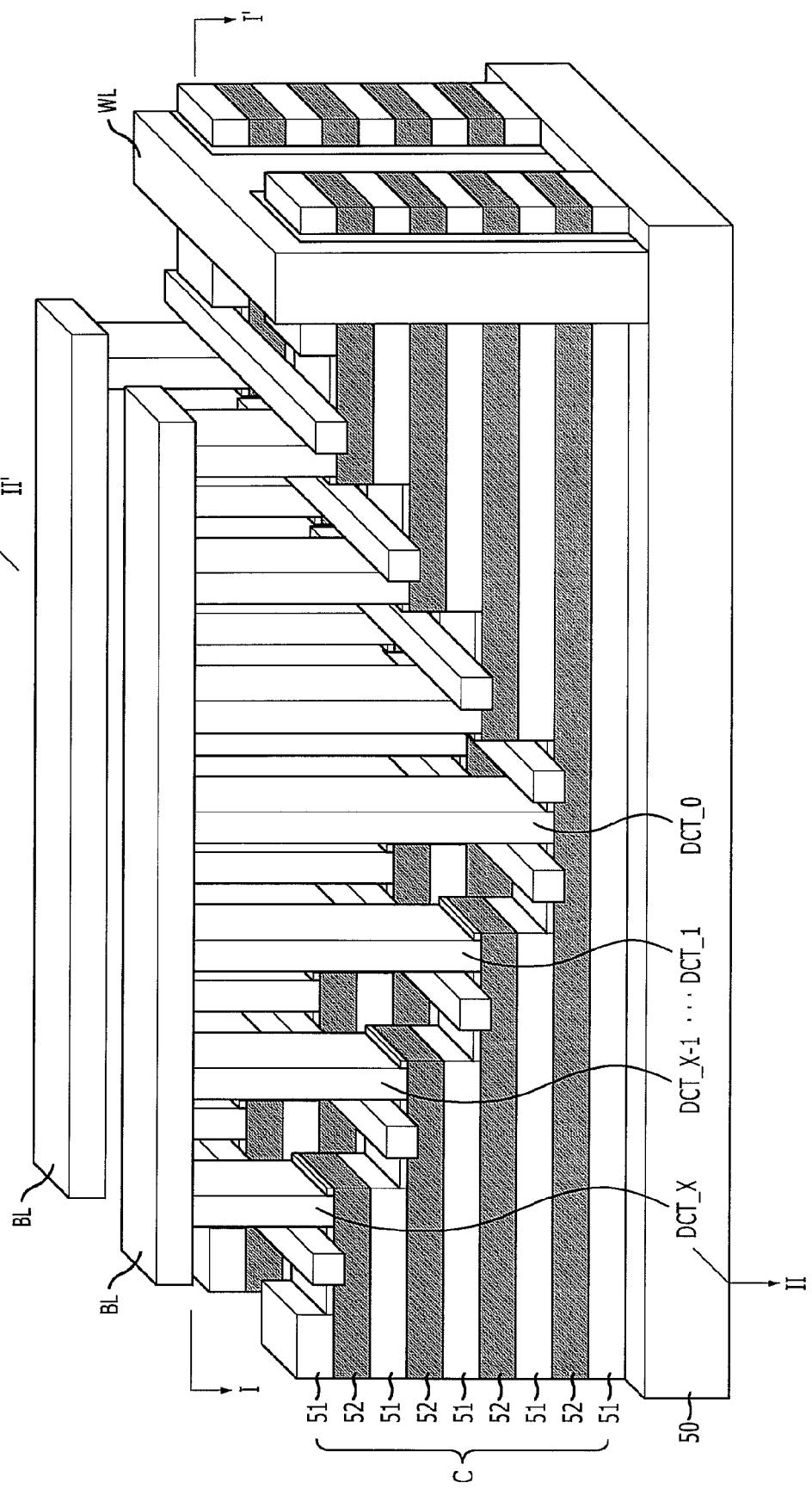

FIGS. 11A to 11C are perspective views of a 3D nonvolatile memory device having drain select lines DSL_0 to DSL_X, drain contact plugs DCT_0 to DCT_X, and bit lines BL formed in accordance with an embodiment of the present invention. For the convenience of description, the illustration of the interlayer insulating layer formed over the intermediate resulting structure will be omitted for conciseness.

Referring to FIG. 11A, a channel structure C at a drain select transistor region is selectively etched to expose the surfaces of a plurality of channel layers 52. The channel structure C may be etched in a stepwise manner to expose the channel layer 52 of each layer.

An ion implantation process may be performed for control of the threshold voltage of a drain select transistor with respect to the resulting structure with the exposed channel layer 52.

A gate dielectric layer 59 is formed on the exposed channel layers 52. The gate dielectric layer 59 may include an oxide layer formed through a low-temperature radical oxidation process or a plasma oxidation process.

Referring to FIG. 11B, a plurality of drain select lines DSL extending in the second direction are formed on the gate dielectric layer 59. That is, a gate electrode conductive layer is formed on each of the gate dielectric layers 59 to form a drain select transistor, and a plurality of drain select lines DSL_0 to DSL_X extending in the second direction are formed to connect the drain select transistors arranged in the second direction (for the convenience of description, only the drain select lines are illustrated in FIG. 11B). Consequently, the drain select transistors formed on the channel layer 52 of the same layer and extending in the second direction are connected by the drain select lines DSL_0 to DSL_X.

A source/drain ion implantation process may be performed for the drain select transistors. Spacers (not shown) may be formed on the sidewalls of the drain select lines DSL_0 to DSL_X.

An insulating layer is formed on the resulting structure including the drain select lines DSL_0 to DSL_X. In FIG. 11B, the illustration of the insulating layer is omitted for the convenience of description.

In this way, when the drain select transistor is formed on each of the channel layers 52, the drain select transistors formed on each layer is turned on/off in a read/write operation, so that a desired page can be selected easily.

Although the present embodiment has described the process of forming the drain select line DSL through a patterning process, the drain select line DSL may be formed through other process such as a damascene process. For example, an insulating layer is formed over the resulting structure including the plurality of channel layers 52, and the insulating layer is selectively etched to form trenches exposing the regions for the drain select lines. A gate dielectric layer 59 is formed on the channel layers 52 exposed at the bottoms of the trenches, and the trenches are filled with a conductive layer to form drain select lines DSL_0 to DSL_X.

Also, a low-voltage transistor of a peripheral circuit region may be formed simultaneously with the formation of the drain select line DSL.

Also, although FIG. 11B illustrates the case of forming the drain select line DSL, a source select line SSL may be formed simultaneously with the formation of the drain select line DSL. That is, a source select line region is selectively etched to expose each of the plurality of channel layers 52, a source select transistor is formed on each of the plurality of channel layers 52, and a plurality of source select lines SSL extending in the second direction are formed to connect source select transistors arranged in the second direction. In this case, the drain select transistor and the source select transistor may be turned on/off to select a desired page in a read/write operation, and an erase operation may be performed by turning on/off or floating the drain select transistor and the source select transistor simultaneously.

That is, when a plurality of drain select lines DSL_0 to DSL_X connected respectively to a plurality of channel layers are formed, a plurality of source select lines SSL_0 to SSL_X may be formed simultaneously in the same form (see FIGS. 11A to 11C). In another exemplary embodiment, only a plurality of drain select lines DSL_0 to DSL_X are formed to be connected respectively to a plurality of channel layers, and source select lines SSL may be formed simultaneously with the formation of the memory cells MC and the word lines WL (see FIG. 10).

Referring to FIG. 11C, an insulating layer (not shown) is etched to form a drain contact hole exposing each of the surfaces of the channel layers 52, and the drain contact holes are filled with a conductive layer to form a plurality of drain contact plugs DCT_0 to DCT_X connected respectively to the channel layers 52. A plurality of bit lines BL are formed in such a way that they extend in parallel in the first direction and are connected to the drain contact plugs DCT_0 to DCT_X arranged in the first direction.

In accordance with the embodiment of the present invention described above, the channel structure C with the stacked channel layers 52 is used to form the plurality of memory cells MC and to form the drain select transistors connected respectively to the plurality of channel layers 52. Thus, the operation of the 3D nonvolatile memory device can be easily controlled by activating/deactivating the drain select lines connected respectively to the plurality of channel layers 52.

In particular, because the source select transistors are formed in the same structure simultaneously with the formation of the drain select transistors, the operation of the 3D nonvolatile memory device can be controlled more easily.

Also, because the drain select lines are connected respectively to the plurality of channel layers 52, the RC delay for the capacitance or the word-line resistance can be minimized and the integration density of the memory device can be further improved.

As described above, the present invention stacks the memory cells along the sidewall of the channel structure with the stacked channel layers, thereby making it possible to fabricate the 3D nonvolatile memory device with the stacked strings. According to this structure, the RC delay for the capacitance or the word-line resistance can be minimized and the integration density of the memory device can be improved.

Also, because the memory cells MC are formed at both sides of the channel layer, the channel can be easily controlled in a depletion mode operation and the memory device can be easily controlled by increasing the amount of current flow in the channel in an enhancement mode operation.

Also, because the tunnel insulating layer, the charge trapping layer, and the charge blocking layer are sequentially formed after the formation of the channel layer, the layer quality of the tunnel insulating layer can be improved. Also, because the channel layer is formed of monocrystalline silicon, the current flow in the channel and the uniformity of threshold voltage distribution can be improved.

Also, because the drain select transistors connected respectively to the channel layers are formed to easily select a desired page in a read/write operation, the operation of the 3D nonvolatile memory device can be easily controlled. In particular, because the source select transistors are formed in the same structure simultaneously with the formation of the drain select transistors, the operation of the 3D nonvolatile memory device can be controlled more easily.

While the present invention has been described with respect to the specific embodiments, it will be apparent to those skilled in the art that various changes and modifications may be made without departing from the spirit and scope of the invention as defined in the following claims.

What is claimed is:

1. A three-dimensional nonvolatile memory device, comprising:
   a plurality of channel structures extending in parallel in a first direction and comprising a plurality of channel layers that are alternatively stacked with a plurality of interlayer insulating layers over a substrate;
   a plurality of memory cells stacked along sidewalls of the channel structures and arranged in the first direction and a second direction crossing the first direction;
   a plurality of word lines extending in parallel in the second direction and connected to the memory cells arranged in the second direction;
   a plurality of drain select transistors connected respectively to the channel layers of the channel structures;
   a plurality of drain select lines extending in parallel in the second direction and connected to the drain select transistors arranged in the second direction; and
   a plurality of bit lines extending in parallel in the first direction and connected to the channel layers of the channel structures, wherein all channel layers included in one channel structure are connected to a same bit line.

2. The three-dimensional nonvolatile memory device of claim 1, wherein the memory cells arranged in the first direction to share one of the channel layers constitutes one string.

3. The three-dimensional nonvolatile memory device of claim 1, wherein the memory cells formed on a same layer, among the memory cells sharing one of the word lines, perform a read/write operation as one page.

4. The three-dimensional nonvolatile memory device of claim 1, wherein the word lines are connected to an X-decoder.

5. The three-dimensional nonvolatile memory device of claim 1,
   wherein the drain select transistors are turned on/off to select a desired page in a read/write operation.

6. The three-dimensional nonvolatile memory device of claim 1, further comprising:
   a plurality of source select transistors and connected respectively to the channel layers of the channel structures,
   wherein the source select transistors and the drain select transistors are turned on/off to select a desired page in a read/write operation.

7. The three-dimensional nonvolatile memory device of claim 5,
   wherein the drain select lines are connected to a Z-decoder.

8. The three-dimensional nonvolatile memory device of claim 1, wherein the memory device comprises X drain select lines for each memory block when X channel layers are stacked, wherein X is a natural number.

9. A method for fabricating a three-dimensional nonvolatile memory, comprising:
   stacking a plurality of channel layers alternately with a plurality of interlayer insulating layers over a substrate;
   etching the channel layers and the interlayer insulating layers to form a plurality of channel structures extending in parallel in a first direction;
   forming a plurality of memory cells stacked along the sidewalls of the channel structures and arranged in the first direction and a second direction crossing the first direction;
   forming a plurality of word lines extending in parallel in the second direction and connected to the memory cells arranged in the second direction; and
   forming a plurality of drain select transistors respectively connected to the channel layers of the channel structures;
   forming a plurality of drain select lines extending in parallel in the second direction and connected to the drain select transistors arranged in the second direction; and
   forming a plurality of bit lines extending in parallel in the first direction and connected to the channel layers of the channel structures, wherein all channel layers included in one channel structure are connected to a same bit line.

10. The method of claim 9, wherein the forming of a plurality of memory cells comprises:
   filling a gap region between the channel structures with an insulating layer;
   selectively etching the insulating layer to form trenches for the memory cells;
   sequentially forming a tunnel insulating layer, a charge trapping layer, and a charge blocking layer over the resulting structure including the trenches; and
   filling the trenches including the tunnel insulating layer, the charge trapping layer, and the charge blocking layer with a gate electrode conductive layer.

11. The method of claim 9, wherein the forming of a plurality of memory cells comprises:
   sequentially forming a tunnel insulating layer, a charge trapping layer, a charge blocking layer, and a gate electrode conductive layer over the channel structures;
   selectively etching the gate electrode conductive layer, the charge blocking layer, the charge trapping layer, and the tunnel insulating layer; and
   filling the etched region with an insulating layer.

12. The method of claim 9, further comprising, after forming a plurality of word lines:
   removing an insulating layer filling a gap region between the channel structures; and
   performing an ion implantation process.

13. The method of claim 12, further comprising:
   performing a re-oxidation process after removing the insulating layer.

14. The method of claim 12, further comprising:
   forming an insulating layer over the resulting structure after performing the ion implantation process.

15. The method of claim 9, wherein a plurality of source select lines are formed simultaneously with the formation of the memory cells and the word lines.

16. The method of claim 15, further comprising, after forming a plurality of source select lines:
   etching a source line region between the source select lines to form source line trenches; and
   filling the source line trenches with a conductive layer to form source lines.

17. The method of claim 9, further comprising:
   selectively etching the channel structures at drain select transistor regions to expose the surfaces of a plurality of channel layers; and
   forming a gate dielectric layer over the exposed channel layers;
   wherein the plurality of drain select lines are formed over the gate dielectric layer.

18. The method of claim 17, wherein a plurality of source select lines are formed simultaneously with the formation of the drain select lines.

19. The method of claim 17, further comprising, after forming the plurality of drain select lines:
   forming an insulating layer over the resulting structure including the drain select lines;
   selectively etching the insulating layer to form drain contact holes exposing the channel layers; and
   filling the drain contact holes with a conductive layer to form drain contact plugs connected respectively to the channel layers;
   wherein the plurality of bit lines are connected to the drain contact plugs arranged in the first direction.

* * * * *